United States Patent
Savithri et al.

(10) Patent No.: US 6,493,853 B1
(45) Date of Patent: Dec. 10, 2002

(54) CELL-BASED NOISE CHARACTERIZATION AND EVALUATION

(75) Inventors: Nagaraj N. Savithri, Dallas, TX (US); John Apostol, Plano, TX (US); Anthony M. Hill, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 186 days.

(21) Appl. No.: 09/617,575

(22) Filed: Jul. 17, 2000

Related U.S. Application Data

(60) Provisional application No. 60/143,972, filed on Jul. 15, 1999, and provisional application No. 60/153,599, filed on Sep. 13, 1999.

(51) Int. Cl.[7] .............................................. G06F 9/45
(52) U.S. Cl. ................................................ 716/5; 716/6
(58) Field of Search ........................................ 716/5, 6

(56) References Cited

U.S. PATENT DOCUMENTS

| | | | | |
|---|---|---|---|---|
| 5,535,133 A | * | 7/1996 | Petschauer et al. | ......... 361/774 |
| 6,449,753 | * | 9/2002 | Aingaran et al. | ............... 716/5 |

OTHER PUBLICATIONS

Vittal, A. et al. "Modeling crosstalk in resistive VLSI interconnections", IEEE, VLSI Design, 1999, pp. 470–475.*

* cited by examiner

Primary Examiner—Vuthe Siek
Assistant Examiner—Brandon Bowers
(74) Attorney, Agent, or Firm—Gerald E. Laws; W. James Brady, III; Frederick J. Telecky, Jr.

(57) ABSTRACT

In deep submicron technologies, coupling capacitance significantly dominates the total parasitic capacitance. This causes crosstalk noise to be induced on quiescent signals which could lead to catastrophic failures. A methodology is provided that is a practical approach to full-chip crosstalk noise verification. A multi-dimensional noise lookup table is formed for a cell used within the IC, wherein the multi-dimensional noise table relates a set of input noise pulse characteristics and a set of output loading characteristics to an output noise pulse characteristic of the cell. A noise pulse on an input to an instantiation of a cell is determined and then characterized. An output loading characteristic of the cell is also made. A prediction of whether the instantiation of cell will propagate the noise pulse is made by selecting an output noise pulse characteristic from the multi-dimensional noise table corresponding to the noise pulse characteristic and to the output loading characteristic. Other instantiations of the cell are evaluated using the same multi-dimensional noise table. A prediction of whether each instantiation of cell will propagate the noise pulse is made by selecting an output noise pulse characteristic from the multi-dimensional noise table corresponding to the noise pulse characteristic and to the output loading characteristic associated with each instantiation of the cell.

13 Claims, 5 Drawing Sheets

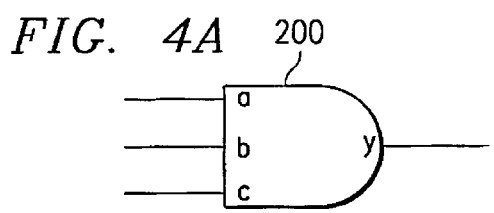
FIG. 4A
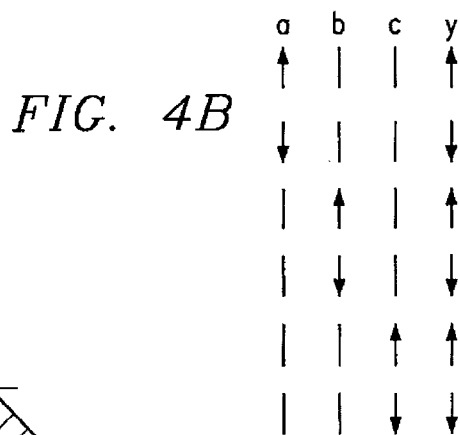
FIG. 4B
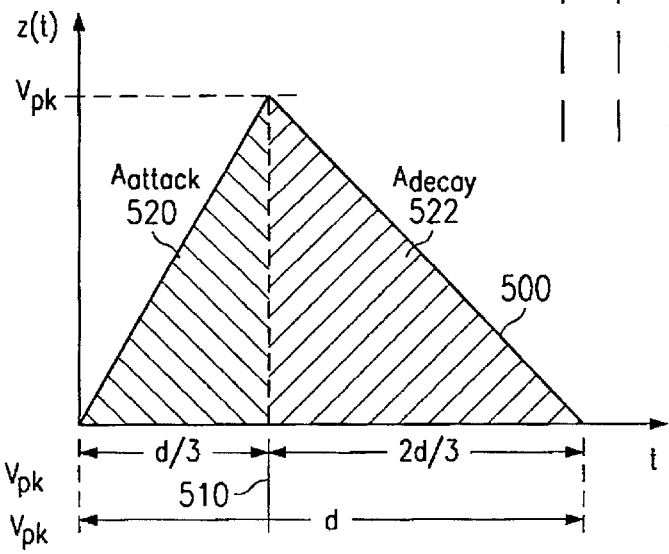
FIG. 5
Area = $A_{attack} + A_{decay}$
$V_{pk_l} < V_{pk} < V_{pk_u}$
$V_{pk_l}$ = LOWER BOUND ON $V_{pk}$
$V_{pk_u}$ = UPPER BOUND ON $V_{pk}$
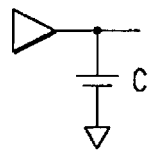
FIG. 6A
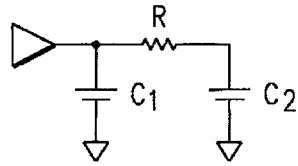
FIG. 6B
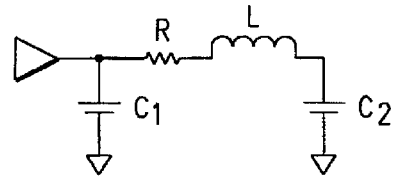
FIG. 6C
FIG. 7
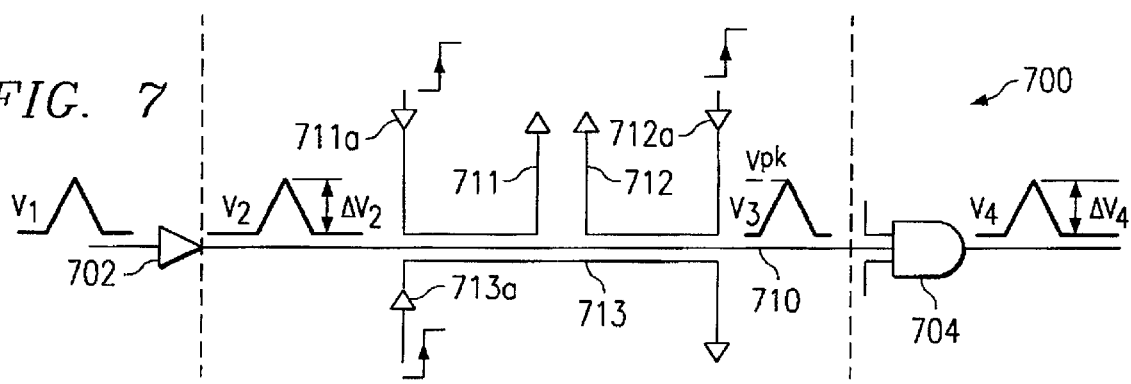
$V_1, V_3$ ARE GIVEN BY NOISE TOOL (FIG. 1)
$\Delta V_2, \Delta V_4$ OBTAINED FROM NOISE-PROPAGATION CHECKER (FIG. 1)

CELL-BASED NOISE CHARACTERIZATION AND EVALUATION

This application claims priority under 35 USC §119(e)(1) of Provisional Application No. 60/143,972, filed Jul. 15, 1999 and Provisional Application No. 60/153,599, filed Sep. 13, 1999.

CROSS REFERENCE TO RELATED APPLICATIONS

This application is related to co-assigned application Ser. No. 09/608,309 (TI-28044) filed contemporaneously herewith and incorporated herein by reference.

TECHNICAL FIELD OF THE INVENTION

This invention relates to methods for designing and fabricating digital circuits, and in particular to simulation and analysis of the circuit design in order to detect and eliminate crosstalk induced by capacitive coupling.

BACKGROUND OF THE INVENTION

Before an integrated circuit is fabricated, a trial design is first analyzed by simulating the operation of the proposed circuits that are to be included within the integrated circuit. Simulation is used to verify correct functional operation of the circuit, as well as to verify correct dynamic timing operation. When two signal lines on an integrated circuit are physically adjacent there is a capacitance between the signal lines that may cause signal interference due to signal coupling.

Signal integrity is one of the key challenges in design and test, now and beyond 100 nm technologies. Rapid technology scaling is causing increased coupling capacitances due to reduced signal to signal spacing and increased distance from the substrate. Among several types of noise, crosstalk noise introduced due to parasitic coupling is predominant in digital designs. Interconnect parasitic coupling has two effects, at least. A first effect is on the delay due to different switching patterns and this affects the performance of the chip besides potential race conditions. A second effect is induced glitches or noise that could cause functional failure by switching logic-states. In the case of designs employing dynamic logic design styles, this problem is more severe due to increased noise sensitivities of pre-charged nodes. In the case of static logic, except for asynchronous signals such as preset/clear and clock nodes, a failure could result only when data inputs connected to storage elements are latched during the active phase of the clock.

Design complexities are increasing with system on chip (SOC) designs and increased length of interconnect at full-chip level is one of the major sources of crosstalk noise problem. This refers to integration of system level functions, for example, many functions in a cellular telephone integrated into one integrated circuit (IC). Typically, SOC designs have CPU cores, memory blocks, logic blocks and possibly analog design blocks, all on one chip. Dynamic simulation of large designs with millions of parasitics is computationally prohibitive; in order reduce computational loads, static noise verification is used. Magnitude of the parasitic coupling, behavior of victim drivers during noise injection and dependency between factors like timing and parasitic coupling are some of key challenges in noise verification.

A commonly used simulator for designing integrated circuits is SPICE, which is available from the University of California at Berkeley, via the Department of Electrical Engineering and Computer Sciences. However, a SPICE simulation of all the nets in an entire chip is far too complex to be practical.

In order to perform a SPICE simulation of a circuit, all of the nodes between every component in the circuit need to be numbered. Then those nodes, the type of components at each node, and the component magnitudes are entered into the SPICE program.

If the circuit which is being simulated is an entire integrated circuit chip, then the number of nodes and corresponding components which need to be entered into the SPICE program is overwhelming. Firstly, the number of nets may be 40,000 in a current typical integrated circuit design. Secondly, for each such net, about seventy discreet components need to be entered because in the actual chip, the net components are distributed. Specifically, each signal line has capacitance which is distributed throughout the line; and each signal line also has a resistance which is distributed throughout the line. To simulate these distributed components, each signal line needs to be represented by a RC ladder circuit which has about two dozen nodes; with each node having a resistor to the next node, a capacitor to ground, and a capacitor to any adjacent signal line.

After all of the nodes and corresponding components for all the nets are entered into the SPICE program, the program operates to determine the voltages which occur on each node in sequential increments of time. Typically, about 1,000 increments of ten picoseconds each are needed to obtain the entire voltage waveform on a node in one net in an integrated circuit chip. To determine the voltages for just one time increment the SPICE program repetitively solves a matrix equation which is of the form $[Y][V]=[I]$. Here, Y is an n-x-n matrix, V is an n×1 matrix, and I is an n×1 matrix; where n is the number of nodes in the circuit. Thus, for a single victim net with twenty aggressor nets, n is (24 nodes per net)×(21 nets) or 504.

For each increment in time the SPICE program makes about five iterations before it converges on a solution. This iterative process is repeated for each of the subsequent time increments. Using a current state of the art workstation, it takes about ten minutes to perform a SPICE simulation of a single circuit which has 500 nodes and for which a solution is sought for 1,000 time increments. Such a circuit represents a typical victim net with twenty aggressor nets. Consequently, to simulate a chip which has 40,000 nets would take about 400,000 minutes, or more than 270 days to complete!

Accordingly, a primary object of the present invention is to provide a method of designing circuit chips by which the above problems are overcome.

Other objects and advantages will be apparent to those of ordinary skill in the art having reference to the following figures and specification.

SUMMARY OF THE INVENTION

A methodology is provided that is a practical approach to full-chip crosstalk noise verification. A multi-dimensional noise lookup table is formed for a cell used within the IC, wherein the multi-dimensional noise table relates a set of input noise pulse characteristics and a set of output loading characteristics to an output noise pulse characteristic of the cell. A noise pulse on an input to an instantiation of a cell is determined and then characterized. An output loading characteristic of the cell is also made. A prediction of whether the instantiation of cell will propagate the noise pulse is made by selecting an output noise pulse characteristic from the multi-dimensional noise table corresponding to the noise pulse characteristic and to the output loading characteristic. Other instantiations of the cell are evaluated using the same multi-dimensional noise table. A prediction of whether each instantiation of cell will propagate the noise pulse is made by selecting an output noise pulse characteristic from the multi-dimensional noise table corresponding to the noise pulse characteristic and to the output loading characteristic associated with each instantiation of the cell.

In another form of the invention, an integrated circuit is fabricated according to a modified trial layout.

In another form of the invention, a computer system is provided which as a mass storage device that holds a design program for designing an integrated circuit according to the above described method.

These and other features of the invention that will be apparent to those skilled in the art from the following detailed description of the invention, taken together with the accompanying drawings.

DESCRIPTION OF THE DRAWINGS

FIG. 4A is an example of cell, being a three input AND gate;

FIG. 4B is an example of a set of sensitization vectors used to stimulate the cell of FIG. 4A in order to create a multi-dimensional noise look-up table for the flow chart of FIG. 3;

FIG. 5 is a timing diagram illustrating an example input noise pulse that is correlated with the sensitization vectors of FIG. 4B;

FIGS. 6A, 6B, and 6C are schematic diagrams illustrating examples of load models that may be used to produce the multi-dimensional noise look-up table of FIG. 3;

FIG. 7 is an illustration of a minimum-region network in which crosstalk induced noise is analyzed using the multi-dimensional noise look-up table scheme of FIG. 3;

Corresponding numerals and symbols in the different figures and tables refer to corresponding parts unless otherwise indicated.

DETAILED DESCRIPTION OF THE INVENTION

Aspects of the present invention include methods and apparatus for designing an integrated circuit. In the following description, specific information is set forth to provide a thorough understanding of the present invention. Well-known circuits and devices are included in block diagram form in order to not to complicate the description unnecessarily. Moreover, it will be apparent to one skilled in the art that specific details of these blocks are not required in order to practice the present invention. As discussed above, interconnect parasitic coupling has two effects, at least, that are important in the design of an integrated circuit. A first effect is on the delay due to different switching patterns and this affects the performance of the chip besides potential race conditions. The second effect is induced glitches or noise that could cause functional failure by switching logic-states. A method for improving simulation results in view of the second effect is described co-assigned application Ser. No. 09/608,309 (TI-28044) Method for Verification of Crosstalk Noise in a CMOS Design and is incorporated herein by reference. Methods for improving simulation results in view of the first effect is disclosed in co-assigned application Ser. No. 09/240,993 (TI-25003) entitled Method for Analyzing Circuit Delays Caused by Capacitive Coupling in Digital Circuits and is incorporated herein by reference. Methods described in TI-28044 and TI-25003 may be advantageously combined with methods described herein.

Figure 1:
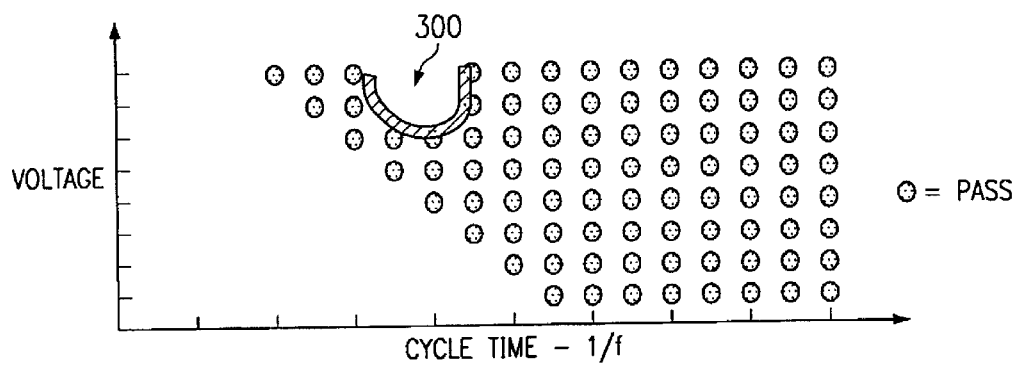
FIG. 1 illustrates a schmoo diagram depicting a crosstalk induced failure.

FIG. 1 illustrates a schmoo diagram (plot of operating voltage vs. frequency of operation) depicting how a crosstalk induced failure could manifest in practice in the operation of an integrated circuit (IC). Depending on the timing relationship, induced noise could cause an operational failure of the IC at certain frequencies and voltages, such as in region 300, whereas the IC could operate correctly at neighboring frequencies outside of region 300. This could be a hard problem to detect during product qualification as a schmoo is generally created at discrete frequencies. Also, a complete set of test vectors used to exercise the IC may not be complete during product qualification, which could leave room for failure if crosstalk noise is not detected during the design phase.

Table 1 defines several terms that are used throughout this document.

TABLE 1

Definition of Terms

| | |
|---|---|
| coupled | Refers to two nets with the capacitance between them modeled as a capacitor connected to the two nets of value equal to the capacitance between the nets. (also known as true C); |
| decoupled | refers to two nets with the capacitance between them modeled as two capacitors. Each capacitor has one terminal connected to GND and one terminal connected to each of the nets. The value of both capacitors is equal in value to the capacitance between the nets. The only time the values are different than the capacitance between the two nets is when coupling compensation is being performed. (also known as lump c) |
| distributed parasitics | refers to a net modeled as a network of resistors, capacitors. and/or inductors with possibly capacitance at each of the nodes in the net. |
| lumped parasitics | refers to a net or portion of a net where the resistance and inductance of the net are not modeled. In this case the capacitance would be lumped on a single node that would model a net or portion of a net. |
| net | a collection of electrically connected interconnect lines. |
| node | an electrical junction where one or more resistors/inductors are joined. Nodes may be added to a net when resistors/inductors are used to model the parasitics of the interconnect lines making up a net. |
| victim | a net that is being affected by transitions on a nearby aggressor net. |
| aggressor | a net that is affecting the operation of the victim net. |

It has now been discovered that very fast noise analysis can be performed by taking advantage of a cell-based environment. Most designs are built in a cell-based flow where all transistors are encapsulated within gates. An individual gate may be included as a cell in a design cell library for reuse in various IC designs. Also, a functional circuit that includes many gates can also be designated as a cell in a design cell library. A further aspect of interconnect parasitic coupling of noise is that for a given cell, if the magnitude of the coupled noise exceeds a threshold value of that cell, then the coupled noise will be propagated by that cell; however, the threshold may vary depending on various characteristics of the coupled noise signal and the environment in which the cell is instantiated. Conversely, if a given noise signal with identified characteristics does not exceed a threshold associated with a given cell and associated cell environment, then the cell will not propagate the noise signal. It has now been discovered that noise signal characteristics and cell environment can be represented in a multi-dimensional table for a given cell. This table can then be used to quickly predict the operation of the cell.

Figure 2:
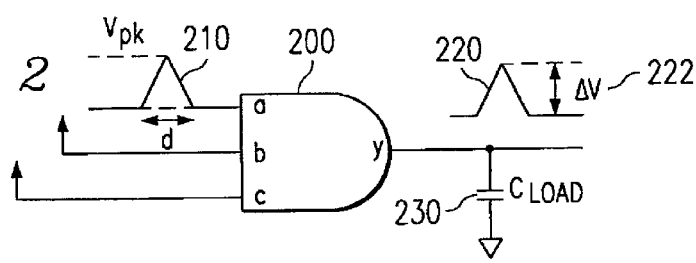
FIG. 2 is an illustration of noise characterization of a cell, according to an aspect of the present invention.

FIG. 2 is an illustration of noise characterization of a cell, according to an aspect of the present invention. Consider any black box logic cell where a cell is composed of multiple transistors, for example: an inverter, a RAM, or an AND 200 gate of FIG. 2. This black box has both input signals, such as a, b, c and output signals such as y where the voltage levels on the output signals are functions of the inputs. The key question in noise analysis is: will a glitch 210 that has a certain voltage/time function z (t), on an input propagate through this black box to the output and if so, how severe is the output glitch 220? Voltage magnitude 222 represents a voltage delta associated with output glitch 220, which correlates to severity of the glitch.

Load capacitor 230 represents the load environment of the cell.

Figure 3:
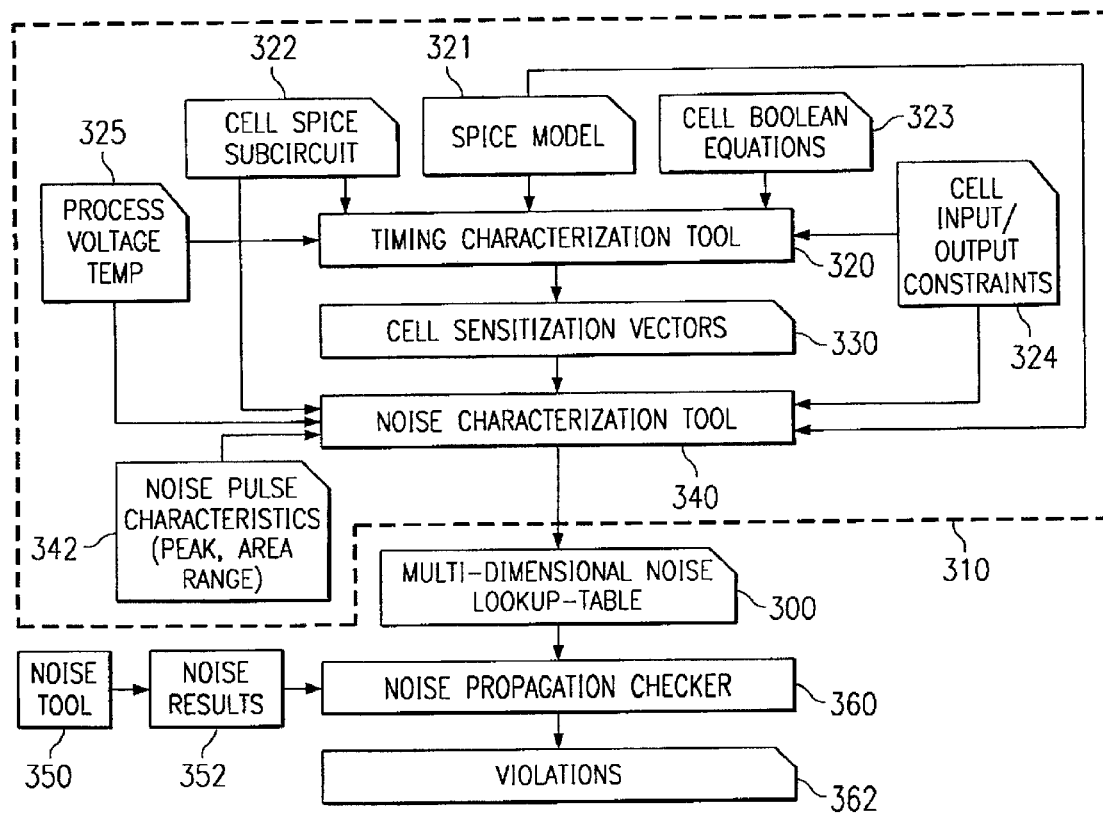
FIG. 3 is a conceptual flow chart of a cell based noise characterization scheme for verification of a circuit layout of an integrated circuit that incorporates a multi-dimensional noise look-up table, according to an aspect of the present invention.

FIG. 3 is a conceptual flow chart of a cell based noise characterization scheme for verification of a circuit layout of an integrated circuit that incorporates a multi-dimensional noise look-up table 300, according to an aspect of the present invention. A given cell, such as cell 200, for example, is first thoroughly analyzed during an analysis phase 310 to form multi-dimensional table 300. A timing characterization tool 320, such as SPICE, for example, is provided with a SPICE model 321 of the cell, cell SPICE subcircuits 322, cell boolean equations 323, cell input/output constraints 324 and process parameters, voltage parameters and temperature parameters 325. Timing characterization tool 320 determines timing related operation of the cell and produces a set of cell sensitization vectors 330.

A noise characterization tool 340, which may also be SPICE for example, then applies the set of cell sensitization vectors 330 to SPICE model 321 of the cell, along with cell SPICE subcircuits 322, cell boolean equations 323, cell input/output constraints 324 and process parameters, voltage parameters and temperature parameters 325 to form multi-dimensional noise look-up table 300. Noise characterization tool 340 also receives noise pulse characteristics 342 that define peak, area and range of a set of noise pulses and forms the multi-dimensional noise look-up table in response to the set of noise pulses 342.

This process is repeated for each cell in a cell design library to form a set of multi-dimensional noise look-up tables, such that each cell has a corresponding multi-dimensional noise look-up table. Of course, cells with similar characteristics may refer to a common noise table such that there may be a fewer number of tables than the number of cells. In this embodiment of the invention, multi-dimensional noise look-up table 300 is three dimensional with the three axes representing: noise peak value, noise pulse width, and cell output load. However, other embodiments of the invention may incorporate even more or different dimensions than included in this embodiment. At each index point of the table, an output noise pulse characteristic is stored that represents a pulse that would be generated for that index value of input noise peak value, input noise pulse width and cell output load.

After an IC has been initially designed by instantiating one or more copies of various cells from the cell design library, instantiated cells can then be quickly analyzed for noise propagation by using a multi-dimensional noise look-up table associated with that cell instance. Noise tool 350 determines what kind of noise pulse will occur on an input of the cell instance, and the noise pulse is characterized to form a tabulation of resultant noise pulse characteristics 352. In this embodiment, resultant noise pulse characteristics 352 include a peak value and noise pulse width for each noise pulse that is detected, which are described in more detail with reference to FIG. 5. Noise tool 350 is a crosstalk noise analysis tool, and is described in more detail with reference to FIG. 8A and 8B.

Noise propagation checker 360 then accesses multi-dimensional noise look-up table 300 for the cell instance using resultant noise pulse characteristic 352 and the cell output load environment of the cell instance as indexes to select an output noise pulse characteristic. Based on the output noise characteristic selected from the table, noise propagation checker can predict if the noise pulse will propagate through the cell instance. Predictions of noise propagation are indicated as a violation 362. Violations are analyzed in further detail and may lead to several actions, such as determination that they will not affect operation of the IC, or result in redesigning the IC to eliminate or reduce the input noise pulse, for example.

FIG. 4A is an example of a cell, being a three input AND gate 200, having three inputs a, b, and c and output y. Referring again to FIG. 3, timing characterization tool 320 determines that a set of sensitization vectors illustrated in FIG. 4B can be used to stimulate the cell of FIG. 4A in order to create a multi-dimensional noise look-up table. Let x=x1, . . . , xn represents a state vector for the n inputs where xi takes values from the set [gnd,vcc]. Suppose this results in the output state y=y1, . . . , ym. To evaluate the effect of a glitch on input xj, a time-varying glitch, z(t) is applied to that input.

FIG. 5 is a timing diagram illustrating an example input noise pulse 500 that is correlated with the sensitization vectors of FIG. 4B. Commonly, z(t) is a triangular waveform characterized by its peak voltage value Vpk, duration d, and breakpoint at time 510. Prior to breakpoint 510, the pulse is increasing and describes an attack area 520. After breakpoint 510, the pulse decays and describes a decay area 522. A total area of the pulse is represented as the sum of attack area 520 and decay area 522. In the present embodiment, only peak voltage Vpk and pulse width d are used as characteristics of the noise pulse for purposes of indexing the multi-dimensional noise look-up table; however, another embodiment may use other characteristics, such as total area or breakpoint positions, for example.

FIGS. 6A, 6B, and 6C are schematic diagrams illustrating examples of load models that may be used to produce the multi-dimensional noise look-up tables of FIG. 3. The loading on output yi can be any arbitrary R(L)C load. Commonly, it will be either a lumped capacitive load, illustrated in FIG. 6A, or a driving point admittance pi model (C-R-C), as illustrated in FIG. 6B. Inductance may also be included in the pi model (C-R-L-C), as illustrated in FIG. 6C. These load models represent the output load seen by an output of a cell. Various values of loading are modeled during analysis phase 310 of FIG. 3 to create the third dimension of the multi-dimensional noise look-up table.

By varying the parameters on z(t) and the loading on each of the yi output signals, a multi-dimensional lookup table can be constructed by noise characterization tool 340 which relates the input voltage and output loading characteristics of a cell to the output noise pulse characteristics of the cell. The cell output loading represents an environment seen be a given instance of the cell, and various instances of a cell may see different load environments.

As an example implementation, a standard cell library is characterized with a noise pulse represented as a function of input peak voltage; input duration, assuming rising waveform accounts for ⅓ of the duration and falling ⅔ of the duration; and a lumped capacitive load on the output.

Specifically, the input waveform is given by:

$$z(t) = Vpk * t(3/d) \qquad t > 0, t < d/3$$
$$= -Vpk/(2*d/3)*t + 3*Vpk/2 \qquad t > d/3, t < d$$

where:
d=duration of the voltage glitch (in sec)
Vpk=peak voltage of the aggressor voltage glitch Note: the above assumes a rising input glitch on xi, i.e., xi nominally at gnd; however, a glitch from xi=vcc can also occur and is considered in actual implementation. In other words, noise tables are calculated for both glitches away from a nominal gnd voltage level and glitches away from the nominal vcc voltage level.

FIG. 7 is an illustration of a minimum-region network in which crosstalk induced noise is analyzed using the multi-dimensional noise look-up table scheme of FIG. 3. Using the characterization data described above, and data available from parasitic extraction of the IC design, the probability that a glitch will propagate can be quickly evaluated. If no propagation of the glitch can be generated, the signal attached to the cell input will have no significant noise problems. Noise pulses V1 and V3 are determined by noise tool 350 of FIG. 3. Noise pulse V1 represents a noise pulse that is induced on an input of inverter cell 702. Noise pulse V3 represents crosstalk noise on an input of AND cell 704 that is coupled from aggressor signal lines 710–712 in response to signal transitions on those signal lines. For cell instance 702 of an inverter cell, output voltage V2 is obtained from a multi-dimensional noise look-up table associated with an inverter cell using noise pulse characteristics of pulse V1. For cell instance 704 of an AND cell, output voltage V4 is obtained from a multi-dimensional noise look-up table associated with an AND cell using noise pulse characteristics of pulse V3.

A minimum region network can be as simple as the channel connected components or can include complete drivers for victims/aggressors. Minimum region network 700 includes victim signal 710 and victim driver 702, along with aggressor signals 711–713 and corresponding aggressor drivers 711a, 712a, and 713a.

Previous approaches to noise analysis include: tx-level noise analysis, which requires large run-times; and heuristic (capacitive divider) approaches which are inaccurate. Advantageously, the present invention enables very fast noise analysis in a cell-based flow.

The crosstalk verification methodology described herein emphasizes pruning the total number of nets in a proposed integrated circuit design to find potential victim clusters and to analyze these clusters independently. A victim cluster is a victim and its associated aggressors. A conceptual flow diagram for this methodology is described in FIG. 8A.

Pruning based on previous characterization of cells is very fast. It also provides greater accuracy than capacitive divider approaches and results in fewer potential noise problems which designers must evaluate.

Pruning will be described briefly herein with reference to FIGS. 8A and 8B. Pruning is described in more detail in application Ser. No. 09/608,309 (TI-28044)) Method for Verification of Crosstalk Noise in a CMOS Design incorporated herein by reference.

Figure 8B:
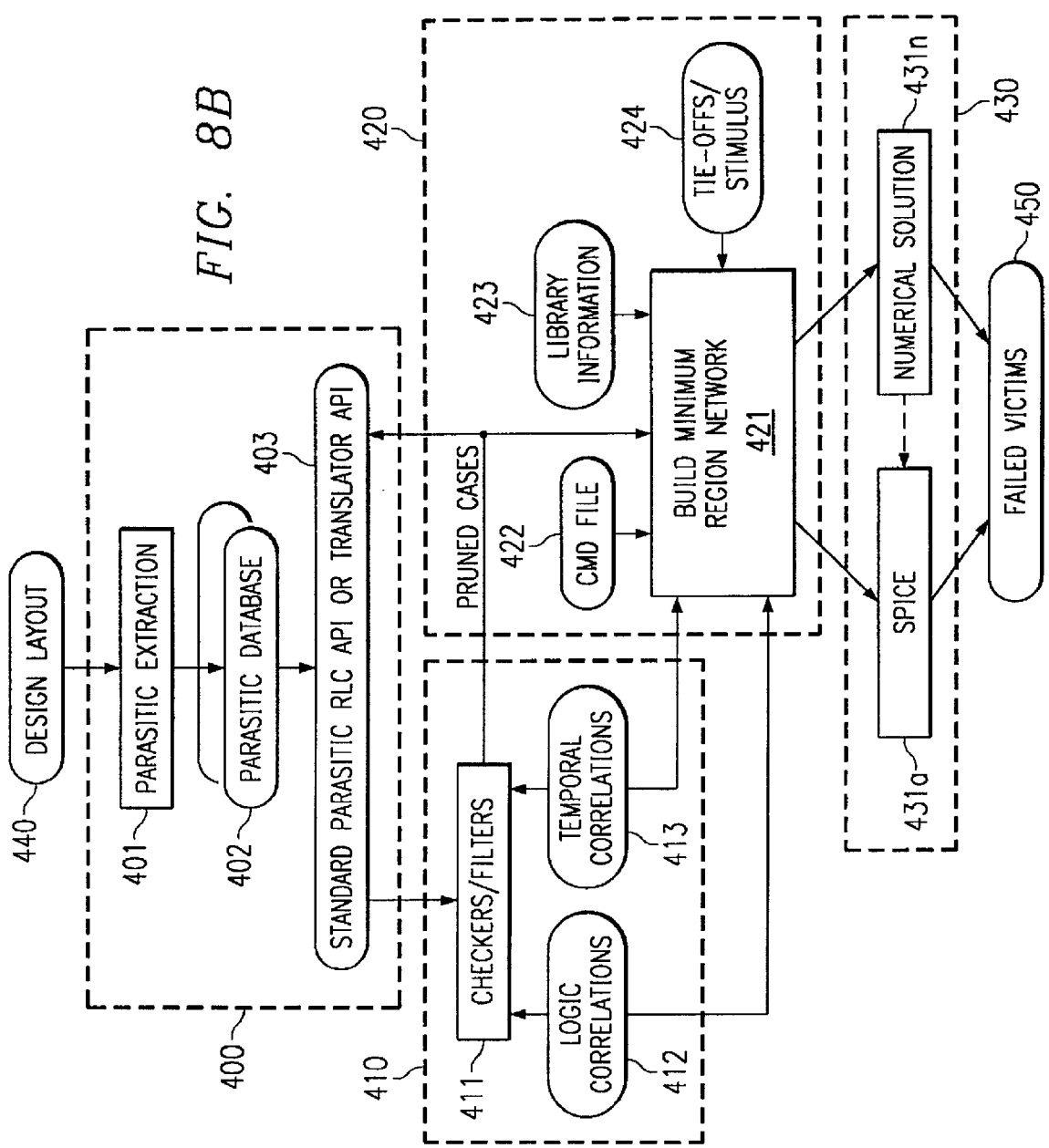
FIG. 8B is a process chart illustrating the methodology of FIG. 8A in more detail
Figure 8A:
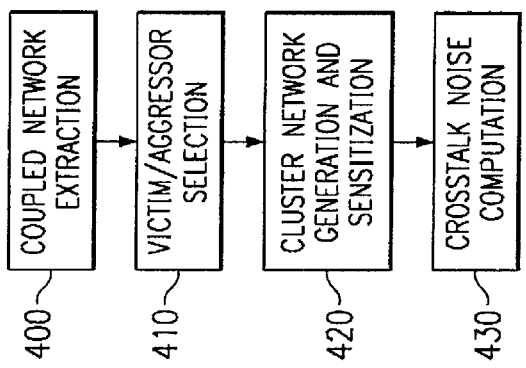
FIG. 8A illustrates a conceptual block diagram of a crosstalk verification methodology, according to aspects of the present invention.

In FIG. 8A, step 400, Coupled Network Extraction, involves detailed parasitic extraction of the entire design including all the coupled parasitics. Typically, this is the most time consuming portion as some form of quasi-3-D or 2.5D approach is used.

Step 410, Victim/Aggressor Selection, involves identification of potential victims and associated aggressors. Both spatial and temporal correlations are typically used in this process. This reduces the problem space and helps focus on potential problems.

Step 420, Cluster Network Generation and Sensitization, involves building a "minimum region network" which constitutes the victim, aggressors and associated R(L,)C parasitics. Minimum region networks could be as simple as only the channel connected components, i.e., the source/drain connected transistors that make up the output stage of a driver, or can include complete drivers for victims/aggressors as shown in FIG. 7.

Step 430, Crosstalk Noise Computation, involves actual crosstalk noise computation and checking for noise propagation. This is typically done using analytical models or some form of electrical simulation. Techniques for reduced order modeling of parasitic networks is known and are helpful in reducing computation times. Failure is typically determined based on noise margins of the victim receivers and using set-up time information from timing analysis.

FIG. 8B is a process chart illustrating the methodology of FIG. 8A in more detail. A trial layout of an integrated circuit design is completed in step 440, using known layout tools. In step 400, a parasitic extraction step 401 produces a parasitic database 402 that is translated for use by other simulation modules by translation step 403. In step 410, filter step 411 makes use of logic correlation step 412 and temporal correlation step 413 to identify potential victim nets and associated aggressor nets. In step 420, a minimum region network is built in step 421 using command file information 422, and library information 423. Since a minimum region net is truncated from the rest of the circuitry, tie-off schemes and stimulus models are provided in step 424. In step 430, various analytical models, such as Spice 431a, or other reduced order modeling tools 431n are used to simulate crosstalk noise and to check for noise propagation. In step 450, victim nets which are susceptible to crosstalk noise are identified based on the results of step 430.

Referring again to FIG. 3, noise tool 350 is representative of the crosstalk analysis done in steps 400, 410, 420 and 430 of FIG. 8B. In FIG. 3, noise results 352 represent failed victims 450 of FIG. 8B. Thus, cell based noise propagation analysis need be done only to failed victims identified after pruning of the entire IC design, advantageously reducing the total amount of analysis work.

Pruning to identify potential victims plays a crucial role in not only minimizing the scope of the problem, but also ensure that all the realistic aggressors are accounted for. The grouping approach to pruning has been very effective in the absence of timing information and for manual inspection of most sensitive victims. Timing-based pruning is critical for reducing pessimism, especially on random logic modules. Crosstalk analysis on independent clusters helps to parallelize computation. Noise propagation could be achieved by instantiating the receivers and DPA model. As most of the reduced order modeling techniques provide reasonably accurate interconnect models, driver models contribute significantly to overall accuracy of crosstalk noise.

It has been found that number of potential victims in a large SOC type of designs, is typically 3–8% of total number of signals, of which typically less than 1% of signals turn out to be real problems. Proper design guidelines for spacing/repeaters and signal transition times often helps minimize the number of potential victims and resulting failures.

Figure 9:
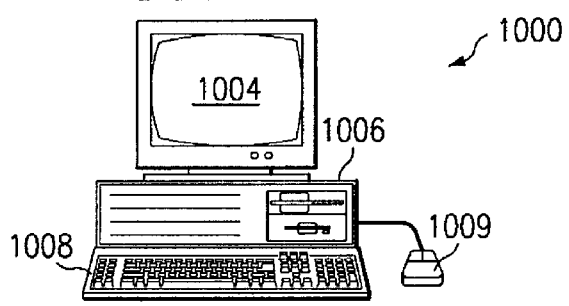
FIG. 9 is an illustration of a computer system that contains a design program for designing integrated circuits incorporating aspects of the present invention.
Figure 10:
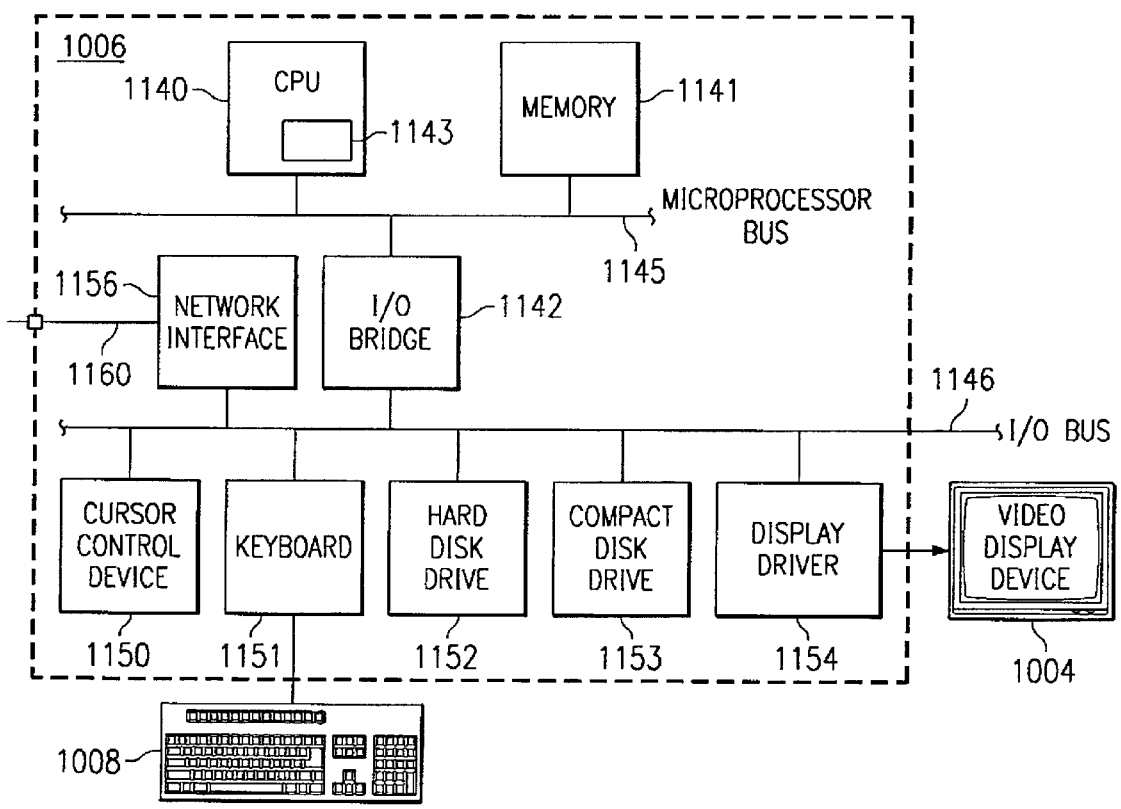
FIG. 10 is a block diagram of the computer of FIG. 9.

FIG. 9 is an illustration of a computer system 1000 which contains a design program incorporating aspects of the present invention, and FIG. 10 is a block diagram of the computer of FIG. 9. A design program that contains steps for designing an integrated circuit according to aspects of the present invention, as described in the following paragraphs, is stored on a hard drive 1152. This design program can be introduced into a computer 1000 via a compact disk installed in a compact disk drive 1153, or down loaded via network interact 1156, or by other means, such as a floppy disk or tape, for example. The program is transferred to memory 1141 and instructions which comprise the program are executed by processor 1140.

Portions of the integrated circuit design are displayed on monitor 1004. The design program includes a simulator for modeling and extracting parasitic effects and simulating the operation of the integrated circuit according to aspects of the present invention.

Figure 11:
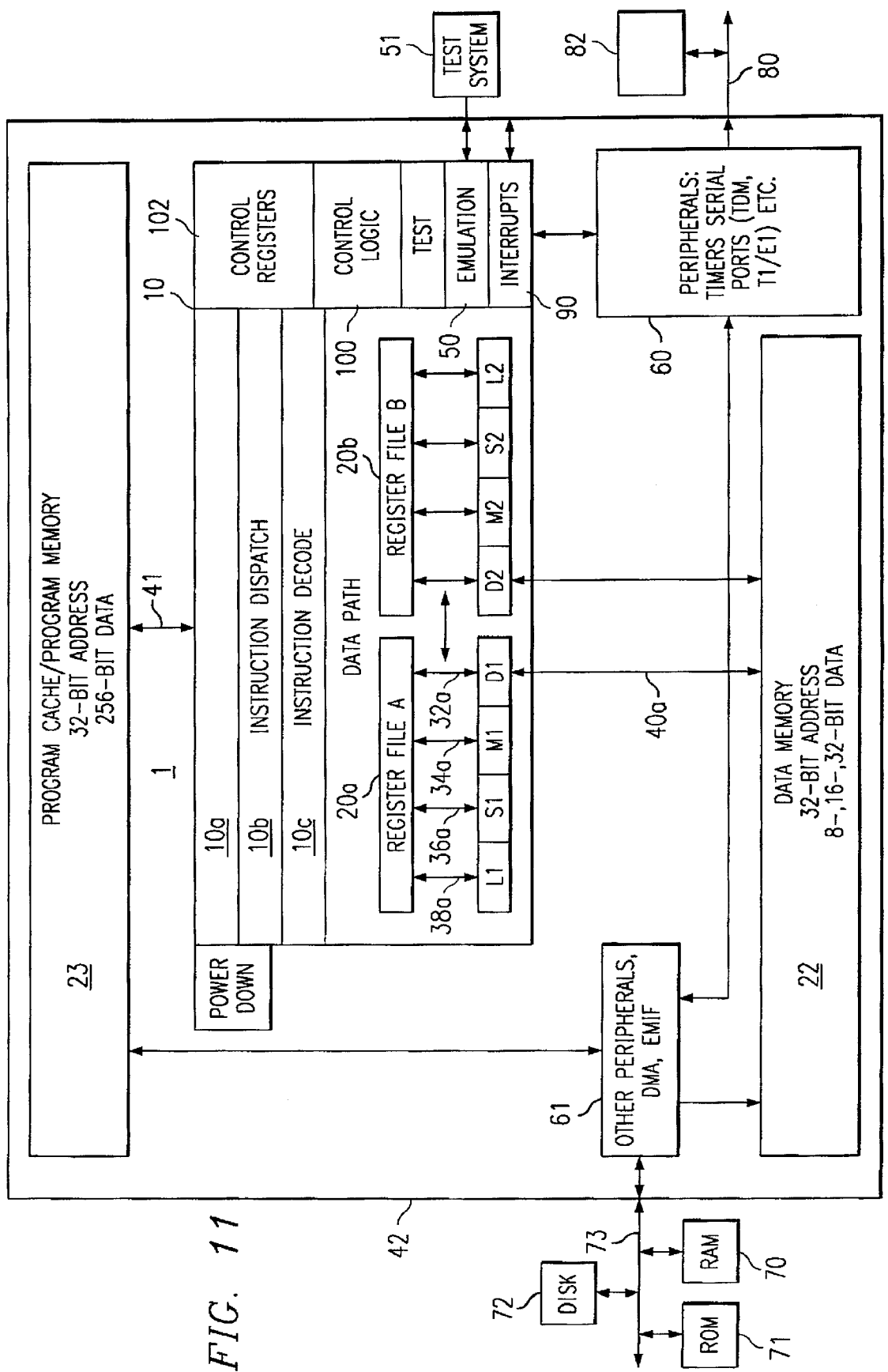
FIG. 11 is a block diagram of an integrated circuit that is designed and fabricated according to aspects of the present invention.

FIG. 11 is a block diagram of a microprocessor 1, which can be designed using aspects of the present invention. Microprocessor 1 is a VLIW digital signal processor ("DSP"). In the interest of clarity, FIG. 11 only shows those portions of microprocessor 1 that are relevant to an understanding of an embodiment of the present invention. Details of general construction for DSPs are well known, and may be found readily elsewhere.

For example, U.S. Pat. No. 5,072,418 issued to Frederick Boutaud, et al, describes a DSP in detail and is incorporated herein by reference. U.S. Pat. No. 5,329,471 issued to Gary Swoboda, et al, describes in detail how to test and emulate a DSP and is incorporated herein by reference. Details of portions of microprocessor 1 relevant to an embodiment of the present invention are explained in sufficient detail hereinbelow, so as to enable one of ordinary skill in the microprocessor art to make and use the invention.

In microprocessor 1 there are shown a central processing unit (CPU) 10, data memory 22, program memory 23, peripherals 60 and an external memory interface (EMIF) with a direct memory access (DMA) 61. CPU 10 further has an instruction fetch/decode unit 10a–c, a plurality of execution units, including an arithmetic and load/store unit D1, a multiplier M1, an ALU/shifter unit S1, an arithmetic logic unit ("ALU") L1, a shared multiport register file 20a from which data are read and to which data are written. Decoded instructions are provided from the instruction fetch/decode unit 10a–c to the functional units D1, M1, S1, and L1 over various sets of control lines which are not shown. Data are provided to/from the register file 20a from/to to load/store units D1 over a first set of busses 32a, to multiplier M1 over a second set of busses 34a, to ALU/shifter unit S1 over a third set of busses 36a and to ALU L1 over a fourth set of busses 38a. Data are provided to/from the memory 22 from/to the load/store units D1 via a fifth set of busses 40a. Note that the entire data path described above is duplicated with register file 20b and execution units D2, M2, S2, and L2. Instructions are fetched by fetch unit 10a from instruction memory 23 over a set of busses 41. Emulation unit 50 provides access to the internal operation of integrated circuit 42 which can be controlled by an external test system 51.

Note that the memory 22 and memory 23 are shown in FIG. 11 to be a part of a microprocessor 1 integrated circuit, the extent of which is represented by the box 42. The memories 22–23 could just as well be external to the microprocessor 1 integrated circuit 42, or part of it could reside on the integrated circuit 42 and part of it be external to the integrated circuit 42. Also, an alternate number of execution units can be used.

When microprocessor 1 is incorporated in a data processing system, additional memory or peripherals may be connected to microprocessor 1, as illustrated in FIG. 11. For example, Random Access Memory (RAM) 70, a Read Only Memory (ROM) 71 and a Disk 72 are shown connected via an external bus 73. Bus 73 is connected to the External Memory Interface (EMIF) which is part of functional block 61 within integrated circuit 42. A Direct Memory Access (DMA) controller is also included within block 61. The DMA controller is generally used to move data between memory and peripherals within microprocessor 1 and memory and peripherals which are external to microprocessor 1.

With technology scaling, crosstalk noise has become a problem in a DSM design such as integrated circuit 42. Unlike timing problems, crosstalk noise could manifest only intermittently when certain combinations of signal switching are satisfied. Such failures could happen in the end-application as testers fail to detect them during product qualification. An aspect of the present invention advantageously provides a practical method to perform static noise verification using a cell based noise characterization scheme for verification by using a multi-dimensional noise look-up table, on integrated circuit 42 before it is fabricated. Advantageously, pruning methods based on grouping enables better coverage of potential victims and their associated aggressors, even in absence of timing. For example, buses such as 32a, 34a, 36a, 38a, 40a and 41 can be grouped for victim pruning. Advantageously, timing-based pruning generally reduces pessimism around 30%; required timing information can be determined for integrated circuit 42 using simulation.

Several example systems which can benefit from aspects of the present invention are described in U.S. Pat. No. 5,072,418, which was incorporated by reference herein, particularly with reference to FIGS. 2–18 of U.S. Pat. No. 5,072,418. A microprocessor incorporating an aspect of the present invention to improve performance or reduce cost can be used to further improve the systems described in U.S. Pat. No. 5,072,418. Such systems include, but are not limited to, industrial process controls, automotive vehicle systems, motor controls, robotic control systems, satellite telecommunication systems, echo canceling systems, modems, video imaging systems, speech recognition systems, vocoder-modem systems with encryption, and such.

Fabrication of data processing device 1 after the design is completed and crosstalk violations have been dealt with according to aspects of the present invention, involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

Crosstalk verification is a complex problem involving several sources of error. It is important to know these sources of error and bound the crosstalk problem according to ensure circuit functionality. Sources of error include:
  error in parasitic resistance and coupling capacitance
  error in victim selection
  error in obtaining worst case sensitization of drivers
  error in obtaining switching windows for timing analysis
  error in obtaining logic correlation between signals
  error due to non-linear loads
  error in SPICE models
  error in selecting combinations of strong/weak/nominal SPICE models
  process variation on interconnect and transistors.

Performing a worst case analysis in view of the above would result in highly pessimistic results and needlessly burden the design of an integrated circuit. Advantageously, in a crosstalk verification methodology embodying aspects of the present invention, cell based analysis can quickly determine if a noise signal will be propagated to other nets.

Advantageously, the number of aggressor groups that could act on a given victim can be controlled in the pruning process in response to cell based noise analysis, in an embodiment of the present invention.

Advantageously, having a methodology for efficient noise analysis minimizes overdesign of an integrated circuit. For example, hold times can be analyzed with actual parasitic elements instead of excessive guardbanding. This results in faster time-to-market and less area/power overhead.

The methodology of the present invention accounts for the complete energy being transmitted by an aggressor signal. Previous approaches have tended to look at noise simply as a function of peak aggressor current.

Using a noise characterization methodology according to the present invention allows more failures to be caught on particularly sensitive circuits, which could have been missed if simple global noise thresholds were used.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method for designing an integrated circuit (IC) which contains a plurality of cells with interconnecting signal lines in close proximity, such that capacitive coupling among the signal lines is operable to induce a crosstalk noise pulse on at least one of the signal lines, the method comprising the steps of:
  forming a multi-dimensional noise lookup table for a cell used within the IC, wherein the multi-dimensional noise table relates a set of input noise pulse characteristics and a set of output loading characteristics to an output noise pulse characteristic of the cell;
  determining a first noise pulse on an input to a first instantiation of the cell;
  characterizing the first noise pulse to form a first noise pulse characteristic; and
  predicting if the first instantiation of the cell will propagate the first noise pulse by selecting an output noise pulse characteristic from the multi-dimensional noise table corresponding to the first noise pulse characteristic.

2. The method of claim 1, further comprising the steps of:
  determining a second noise pulse on an input to a second instantiation of the cell;
  characterizing the second noise pulse to form a second noise pulse characteristic; and
  predicting if the second instantiation of the cell will propagate the second noise pulse by selecting an output noise pulse characteristic from the multi-dimensional noise table corresponding to the second noise pulse characteristic.

3. The method of claim 2, further comprising the steps of:
  determining a first output loading characteristic of the first instantiation of the cell; and
  wherein the step of predicting selects an output noise pulse characteristic from the multi-dimensional noise table corresponding to the first noise pulse characteristic and to the first output loading characteristic.

4. The method of claim 3, further comprising the step of forming a plurality of multi-dimensional noise tables respectively associated with a plurality of types of cells used within the IC.

5. The method of claim 4, further comprising the steps of:
  grouping the plurality of signal lines into a plurality of aggressor groups;
  pruning the plurality of signal lines to form a plurality of victim signal lines according to a respective noise pulse characteristic selected from the plurality of multi-dimensional noise tables for each instantiation of the plurality of cells;
  building a minimum region network for each victim signal line of the plurality of victim signal lines comprising the respective victim signal line, aggressor signal lines associated with the respective victim signal line, and associated parasitics; and
  simulating the operation of each minimum region network to determine an amount of noise induced on each respective victim signal line by the aggressor signal lines associated with the respective victim signal line.

6. The method of claim 5, further comprising the step of modifying a trial layout of the integrated circuit if the step of predicting results in predicting propagation of a noise pulse.

7. The method of claim 6, further comprising the step of fabricating the integrated circuit according to the modified trial layout.

8. A computer system, comprising:
  a processor for processing instructions;
  a memory circuit for holding instructions connected to the processor;

a mass storage device for holding a design program operable to transfer the design program to the memory circuit;

wherein the design program on the mass storage device comprises instructions for a method for designing an integrated circuit (IC) which contains a plurality of cells with interconnecting signal lines in close proximity, such that capacitive coupling among the signal lines is operable to induce a crosstalk noise pulse on at least one of the signal lines, the method comprising the steps of;

forming a multi-dimensional noise lookup table for a cell used within the IC, wherein the multi-dimensional noise table relates a set of input noise pulse characteristics and a set of output loading characteristics to an output noise pulse characteristic of the cell;

determining a first noise pulse on an input to a first instantiation of the cell;

characterizing the first noise pulse to form a first noise pulse characteristic; and predicting if the first instantiation of the cell will propagate the first noise pulse by selecting an output noise pulse characteristic from the multi-dimensional noise table corresponding to the first noise pulse characteristic.

9. A mass storage device for holding a design program, wherein the design program on the mass storage device comprises instructions for a method for designing an integrated circuit (IC) which contains a plurality of cells with interconnecting signal lines in close proximity, such that capacitive coupling among the signal lines is operable to induce a crosstalk noise pulse on at least one of the signal lines, the method comprising the steps of:

forming a multi-dimensional noise lookup table for a cell used within the IC, wherein the multi-dimensional noise table relates a set of input noise pulse characteristics and a set of output loading characteristics to an output noise pulse characteristic of the cell;

determining a first noise pulse on an input to a first instantiation of the cell;

characterizing the first noise pulse to form a first noise pulse characteristic; and predicting if the first instantiation of the cell will propagate the first noise pulse by selecting an output noise pulse characteristic from the multi-dimensional noise table corresponding to the first noise pulse characteristic.

10. The mass storage device of claim 9, wherein the mass storage device is a diskette.

11. A method for designing an integrated circuit (IC) which contains a plurality of cells with interconnecting signal lines in close proximity, such that capacitive coupling among the signal lines is operable to induce a crosstalk noise pulse on at least one of the signal lines, the method comprising the steps of;

determining a first noise pulse on an input to a first instantiation of the cell;

characterizing the first noise pulse to form a first noise pulse characteristic; and predicting if the first instantiation of the cell will propagate the first noise pulse by selecting an output noise pulse characteristic from a multi-dimensional noise table corresponding to the first noise pulse characteristic, wherein the multi-dimensional noise table relates a set of input noise pulse characteristics and a set of output loading characteristics to an output noise pulse characteristic of the cell.

12. The method of claim 11, further comprising the steps of:

determining a first output loading characteristic of the first instantiation of the cell; and wherein the step of predicting selects an output noise pulse characteristic from the multi-dimensional noise table corresponding to the first noise pulse characteristic and to the first output loading characteristic.

13. The method of claim 12, further comprising the step of modifying a trial layout of the integrated circuit if the step of predicting results in predicting propagation of a noise pulse.

* * * * *